United States Patent
Ebner

(10) Patent No.: US 7,538,617 B2
(45) Date of Patent: May 26, 2009

(54) CLASS AB AMPLIFIER CIRCUIT WITH COMBINED QUIESCENT CURRENT AND COMMON MODE CONTROL

(75) Inventor: Christian Ebner, Munich (DE)

(73) Assignee: National Semiconductor Germany AG, Unterhaching (DE)

( * ) Notice: Subject to any disclaimer, the term of this patent is extended or adjusted under 35 U.S.C. 154(b) by 83 days.

(21) Appl. No.: 11/746,239

(22) Filed: May 9, 2007

(65) Prior Publication Data

US 2007/0285167 A1 Dec. 13, 2007

(30) Foreign Application Priority Data

May 19, 2006 (DE) ...................... 10 2006 023 710

(51) Int. Cl.
*H03F 3/26* (2006.01)
(52) U.S. Cl. ..................... 330/265; 330/255; 330/267
(58) Field of Classification Search ................. 330/253, 330/255, 258, 261, 263–265, 267
See application file for complete search history.

(56) References Cited

U.S. PATENT DOCUMENTS

| | | | |
|---|---|---|---|
| 4,366,442 A | 12/1982 | Yamada | |
| 4,963,837 A | 10/1990 | Dedic | |
| 5,703,532 A * | 12/1997 | Shin et al. | .................... 330/253 |
| 7,119,616 B2 * | 10/2006 | Benzer | ....................... 330/255 |

FOREIGN PATENT DOCUMENTS

EP 1 353 440 A1 10/2003

* cited by examiner

*Primary Examiner*—Khanh V Nguyen
(74) *Attorney, Agent, or Firm*—Pearne & Gordon LLP

(57) ABSTRACT

It is an object of the present invention to provide an amplifier circuit that supplies a differential output signal (Voutp−Voutn) with a stable common mode potential (½×(Voutp+Voutn)) and a stable amplification characteristic. An essential feature of the invention is a control path (24, 26, 30, 28, 36, 38, 34, 32) feeding back into a control stage of the amplifier circuit for the combined control of the quiescent currents that flow through the output transistors (T1-T4), and of the common mode potential of the differential output signal. By means of this combination of two control functions in one and the same control path (24, 26, 30, 28, 36, 38, 34, 32) any coupling between separate control loops is avoided.

9 Claims, 1 Drawing Sheet

CLASS AB AMPLIFIER CIRCUIT WITH COMBINED QUIESCENT CURRENT AND COMMON MODE CONTROL

BACKGROUND OF THE INVENTION

1. Field of the Invention

The present invention concerns an amplifier circuit, as can be applied for example as a function block in a microelectronic integrated circuit. In particular the invention concerns a so-called class AB amplifier circuit in which a compromise is provided between high linearity of amplification and low power consumption.

2. Description of the Prior Art

This type of amplifier circuit is elucidated, for example, in EP 1 353 440 A1.

An amplifier circuit based on a development within the business organisation of the applicant comprises:

- a first supply terminal and a second supply terminal for the supply to the circuit of a first supply potential and a second supply potential,
- an output stage with a first output node and a second output node for the output of a differential output signal, wherein the first output node is connected via a first output transistor with the first supply terminal, and via a second output transistor with the second supply terminal, and wherein the second output node is connected via a third output transistor with the first supply terminal and via a fourth output transistor with the second supply terminal, and
- a control stage, to which an input signal can be applied to control the output transistors, for the adjustment of quiescent currents flowing through the output transistors even in the absence of the input signal, and for the adjustment of the output signal as a function of the input signal.

An advantage of this amplifier circuit, structured according to the class AB principle, consists in that its output stage delivers a differential, and thus universally usable, output signal.

For the achievement of an amplifier characteristic that is stable in operation it has been demonstrated to be advantageous if at least one of the quiescent currents flowing through the output transistors ("class A component of the class AB amplifier stage") is controlled by means of a feedback.

Furthermore it is advantageous for many applications if the common mode potential of the differential output signal is similarly controlled to a desired required value by a feedback.

Accordingly for the amplifier circuit described in the preceding paragraphs the attempt has been made to control both the quiescent currents and also the common mode potential to particular required values by respective feedback paths. However a serious problem ensued, in that the quiescent current control and the common mode potential control influence one another and as a result the performance characteristics of the amplifier are disadvantageously impaired.

If the bandwidths of the two control loops are similar there even exists the risk that an instability may be generated as a result of coupling between the control functions. It is in fact possible to avoid this problem by the use of very different bandwidths for the two control loops. In this case, however, there remains the disadvantage that the parameter controlled by the slower control loop is then controlled less accurately.

SUMMARY OF THE INVENTION

It is an object of the present invention to provide an amplifier circuit that supplies a differential output signal with a stable common mode potential and a stable amplification characteristic.

According to the invention, this object is substantially achieved with an amplifier circuit, comprising:

- a first supply terminal and a second supply terminal for the supply to the circuit of a first supply potential and a second supply potential,
- an output stage with a first output node and a second output node for the output of a differential output signal, wherein
- the first output node is connected via a first output transistor with the first supply terminal, and via a second output transistor with the second supply terminal, and wherein
- the second output node is connected via a third output transistor with the first supply terminal, and via a fourth output transistor with the second supply terminal, and
- a control stage, to which an input signal can be applied to control the output transistors, for the adjustment of quiescent currents flowing through the output transistors, even in the absence of the input signal, and for the adjustment of the output signal as a function of the input signal, and
- a control path feeding back into the control stage for the combined control of the quiescent currents of the output transistors and a common mode potential of the differential output signal.

Advantageous further developments of the invention which can be provided as such or in combination are described below.

An essential feature of the invention is a control path feeding back into the control stage for the combined control of the quiescent currents of the output transistors and a common mode potential of the differential output signal.

Any disadvantageously acting coupling between separate control loops is advantageously avoided by means of this combination of two control functions in one and the same control path.

A consistent, in particular a relatively large, bandwidth for the control path can be implemented without problems, which path is then effective for both the parameters to be controlled. The control function improved according to the invention is thus in particular advantageously usable for amplifiers with a large amplification bandwidth (e.g. larger than 100 MHz). An interesting area of application for the amplifier circuit according to the invention is e.g. the implementation of an output stage of an operational amplifier.

In one form of embodiment of the invention it is provided that the control stage comprises replicas of the output transistors, each of which is arranged in series with a reference current source, and each of whose control terminals is connected with one of the control terminals of the output transistors. Connected in pairs with each other via their control terminals, output transistors and replica transistors can then act together in the form of a so-called current mirror in order to mirror in each case reference currents, driven through the replica transistors by the reference current sources, onto the output transistors (as their quiescent currents) according to a mirroring relationship. A further advantage of this kind of current mirror arrangement exists in that in the region of the replica transistors a signal representative of one or several quiescent currents can also be tapped or extracted for the control path. The replica transistors of the current mirror arrangement effectively act in this regard also as "sensors" for the currents actually flowing through the output transistors.

In one form of embodiment it is provided that the control path comprises a control amplifier to whose input is applied a control input signal, which contains two additive superimposed signal components, of which a first signal component is representative of at least one of the quiescent currents, and a second signal component is representative of the common mode potential. In this manner the combined control function of the two parameters to be controlled can be implemented particularly simply. If the above-elucidated arrangement of replica transistors is here provided, then the signal component representative of the quiescent current can be provided at a circuit node between one of the replicas and the reference current source arranged with it in series.

As far as the signal component representative of the common mode potential is concerned, this can, for example, be provided at a circuit node that is connected with the two output nodes via two resistance elements of the same resistance value.

By reason of the structure of the output stage it is clear that the quiescent currents flowing via the four output transistors, as also the additional currents varying as a function of the input signal, stand in a particular relationship to one another, or expressed in another way, are not completely independent of each other. For example, an increase of the difference between the currents that are flowing between the first and second output transistors must lead to a corresponding (opposed) increase of the difference between the currents that are flowing between the third and fourth output transistors.

The interdependence of the currents flowing through the four output transistors of the output stage can be utilised for a simplified control of the quiescent currents. In such a form of embodiment it can, for example, be provided that the signal component representative of at least one of the quiescent currents is representative for one of the quiescent currents that has been selected as a minimum current out of the plurality of quiescent currents. In a preferred embodiment it is provided that at one circuit node an additive superposition takes place of a signal representative of the current flowing through the first output transistor with a signal representative of the common mode potential, and at another circuit node an additive superposition takes place of a signal representative of the current flowing through the third output transistor and a signal representative of the common mode potential, and the two circuit nodes are connected via a selection element with the input of a control amplifier, which, from the two signals provided at the two circuit nodes, forwards just that signal that corresponds to the smaller current (minimum current) to the control amplifier. Alternatively or additionally such a current selection and forwarding of a superposition signal representative of the minimum current can be provided for the second and fourth output transistors.

The control stage and/or the control path feeding back to the control stage preferably comprises at least one transconductance stage. In one form of embodiment it is, for example, provided that input terminals of the amplifier circuit are connected with inputs of two transconductance stages, wherein the outputs of the one transconductance stage are connected with the control inputs of the first and third output transistors, and the outputs of the other transconductance stage are connected with the control inputs of the second and fourth output transistors, and wherein the output from the control path (e.g. comprising one or a plurality of transconductance stages) feeds back into the outputs of the two transconductance stages.

BRIEF DESCRIPTION OF THE DRAWING

In what follows the invention is further described with the aid of an example of embodiment with reference to the accompanying drawing. In the FIGURE.

DESCRIPTION OF THE PREFERRED EMBODIMENT(S)

Figure 1:
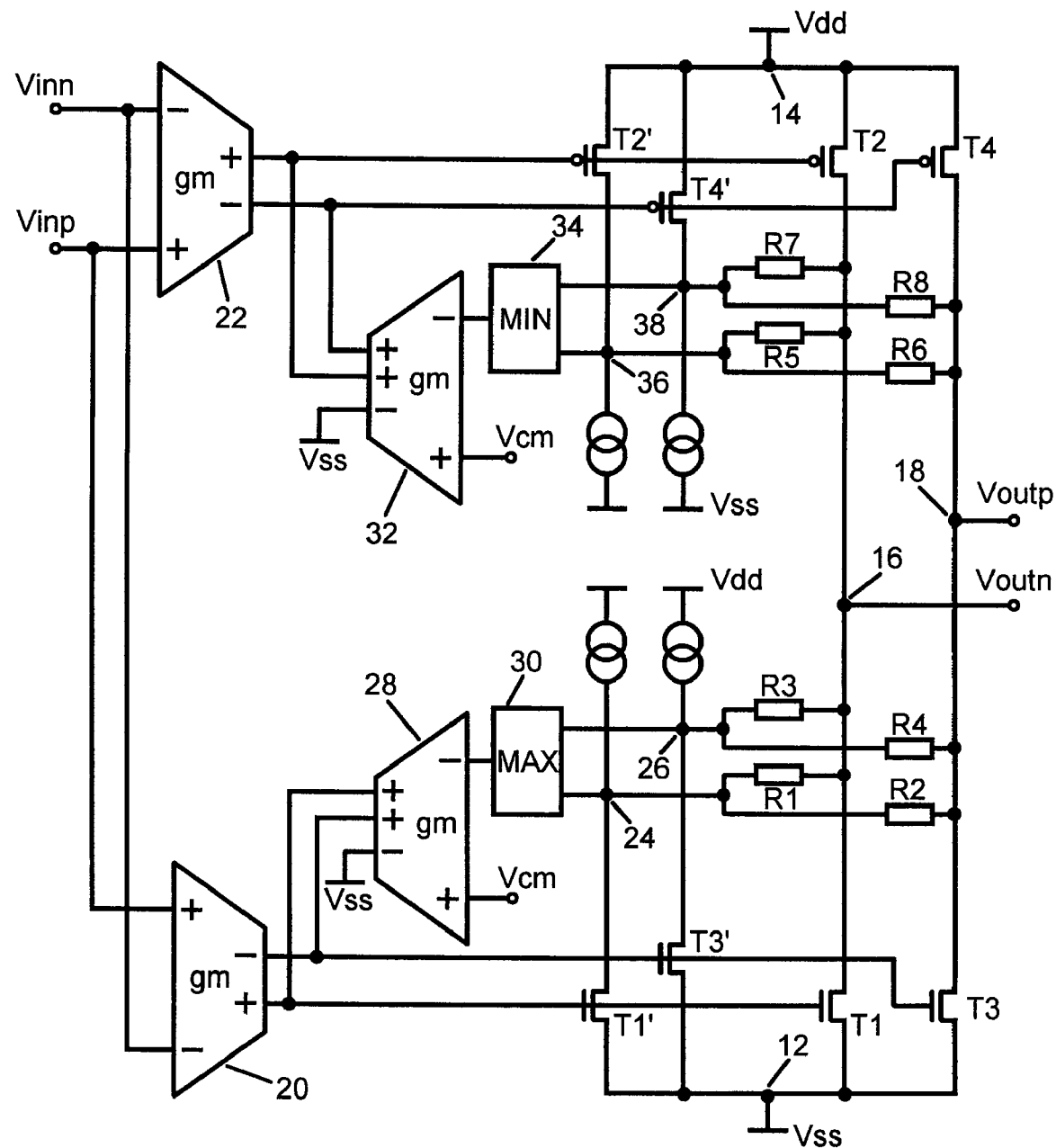
FIG. 1 shows a circuit diagram of a full-differential amplifier circuit with a control path comprising two control amplifiers.

The amplifier circuit represented in FIG. 1 forms an output stage of an operational amplifier produced in CMOS technology, and serves the purpose of linearly amplifying a signal provided from an input stage of the operational amplifier in differential form as potentials Vinn, Vinp, and of outputting the amplified signal as a differential output signal with output potentials Voutn, Voutp.

The amplifier circuit comprises a first supply terminal 12 and a second supply terminal 14 for the supply to the circuit of a first supply potential Vss and a second, in contrast positive, supply potential Vdd.

An output stage of the amplifier circuit comprises a first output node 16 and a second output node 18 for the output of the differential output signal Voutn, Voutp, wherein the output node 16 is connected via a first output transistor T1 with the supply terminal 12, and via a second output transistor T2 with the supply terminal 14, and wherein the output node 18 is connected via a third output transistor T3 with the supply terminal 12, and via a fourth output transistor T4 with the supply terminal 14.

In the example of embodiment represented each of the four output transistors T1 to T4 is formed from an FET, wherein the transistors T1 and T3 are n-channel FETs, whereas the transistors T2 and T4 are p-channel FETs.

When the amplifier circuit is in operation quiescent currents ("bias") of a greater or lesser size are always flowing through the output transistors T1 to T4, even in the absence of the input signal Vinn, Vinp, in order to implement a so-called "class AB" amplification method. In the event of a displacement of the amplifier as a result of the inputted input signal Vinp-Vinn the output transistors are controlled to output an output signal Voutp-Voutn varying linearly with the input signal.

To this end the amplifier circuit comprises a control stage, to which an input signal Vinn, Vinp is applied, which controls the output transistors T1 to T4 to adjust quiescent currents flowing through the output transistors, even in the absence of the input signal, and adjusts the output signal Voutn, Voutp as a function of the input signal Vinn, Vinp. Essential components of the control stage are two full-differential transconductance stages 20, 22, each of which possesses a non-inverting input and an inverting input, wherein the inverting inputs are connected with each other, and the input potential Vinn is applied to them, whereas the non-inverting inputs are connected with each other, and the input potential Vinp is applied to them.

Each of the two transconductance stages 20, 22 furthermore has a non-inverting output and an inverting output. The non-inverting output of the stage 20 is connected with the gate terminal (control connection) of the output transistor T1, the inverting output of the stage 20 is connected with the gate terminal of the output transistor T3, the non-inverting output of the stage 22 is connected with the gate terminal of the output transistor T2, and the inverting output of the stage 22 is connected with the gate terminal of the output transistor T4.

Finally the amplifier circuit comprises a control path feeding back into the control stage for the combined control of the quiescent currents of the output transistors T1 to T4 and a common mode potential of the differential output signal Voutn, Voutp, which is usually defined as ½×(Voutn+Voutp).

The control of the quiescent currents taking place during operation of the amplifier is significant with regard to optimal utilisation of the class AB amplification principle. The control of the common mode potential of the output stage is often a practical requirement with regard to the load driven by the differential output signal Voutn, Voutp.

In the example of embodiment represented the control path provided for this combined control of the two parameters comprises two control path halves, which feedback in a symmetrical manner, on the one hand into the output signal of the first transconductance stage 20, and on the other hand into the output signal of the second transconductance stage 22.

In what follows the control half of the control stage feeding back into the output signal of the first transconductance stage 20 is firstly described.

The control stage comprises replicas T1', T3' of the output transistors T1, T3, each of which is arranged in series with a reference current source, and whose gate terminals in each case are connected with one of the gate terminals of the output transistors T1 and T3. Each of the two series circuits, formed in each case from one replica transistor and one reference current source, as can be seen in FIG. 1, is connected on one hand with the supply potential Vss, and on the other hand with the supply potential Vdd. Each replica transistor (e.g. T1') possesses the same electrical characteristics as its related "original transistor" (e.g. T1). To this end the two transistors are identically designed, or at least possess the same relationship between channel length and channel width. In the non-deflected state of the amplifier the reference current sources define the quiescent currents flowing through the output transistors.

In each of the conductor paths running between the replica transistors T1' and T3' and the respective current sources a circuit node is provided, 24 and 26 respectively. The node 24 is connected via a resistance R1 with the first output node 16 and via a resistance R2 of equal size (resistance) with the output node 18. The node 26 is connected via a resistance R3 with the output node 16 and via a resistance R4 of equal size with the output node 18. In the example of embodiment represented the resistances R1, R2 on the one hand, and the resistances R3, R4 on the other hand, are of equal size.

When the amplifier circuit is in operation an additive superposition of two signal components takes place at each of the nodes 24, 26, of which a first signal component is a function of the current flowing through the output transistor T1 (for the node 24), and is a function of the current flowing through the output transistor T3 (for the node 26), and a second signal component is representative of the common mode potential. This second signal component is coupled into the circuit connections between the replica transistors and their reference current sources via the resistances R1, R2 (for the node 24) and via the resistances R3, R4 (for the node 26). The potentials prevailing at the nodes 24, 26 form a control input signal for a third transconductance stage 28 serving as a control amplifier, or for a maximum element located in the circuit upstream of this stage.

The maximum element 30 has two inputs, each of which is connected to one of the circuit nodes 24, 26. The element 30 furthermore has an output connected with an inverting input of the transconductance stage 28, and has the task of forwarding the larger of the two input potentials to this output. The implementation in circuitry of a maximum element of this kind is trivial for persons skilled in the art and therefore does not require any further elucidation.

The transconductance stage 28 furthermore possesses a non-inverting input at which a prescribable required potential Vcm is applied. The two input potentials fed to the transconductance stage 28 thus form the differential input signal of this stage.

On the output side the transconductance stage 28 has an inverting output, which is connected with the supply potential Vss, and two non-inverting outputs, each of which is connected with one of the outputs of the transconductance stage 20. The transconductance stage 28 is to a certain extent "embodied in duplicate" which means that, based on one and the same input signal, on the one hand a differential output signal is provided between the inverting output and one of the non-inverting outputs, and on the other hand a differential output signal of equal size is provided between the inverting output and the other of the non-inverting outputs. This corresponds to a parallel circuit arrangement of "simply embodied" transconductance stages.

With the previously described components an advantageous combined control of both the quiescent currents and also the common mode potential is realised, wherein in the example represented the supplied required potential Vcm defines a required value for the common mode potential that is to be adjusted. The use of the maximum element 30 has the result that in this combination control the only signal that is taken into account of the signals provided at the superposition nodes 24, 26 is that which contains the signal component representative of the minimum current (of the currents flowing through the output transistors T1 and T3). This has been demonstrated to be particularly advantageous. In a deviation from this, however, another kind of weighting between the signals provided at the nodes 24, 26 could be undertaken.

Symmetrically to the previously described control half, which contains the transconductance stage 28 as a control amplifier, a control half is provided that feeds back into the outputs of the second transconductance stage 22, and contains a fourth transconductance stage 32. The structure of this part of the circuit corresponds essentially to the previously described structure of the lower control half in FIG. 1.

The upper control half in FIG. 1 comprises the replicas T2', T4' of the output transistors T2, T4, each of which is arranged in series with a reference current source, and each of whose gate terminals is connected with one of the gate terminals of the output transistors T2 and T4. Each of the two series circuits, in each case made up of a replica transistor and a reference current source, is on the one hand connected with the supply potential Vss and on the other hand with the supply potential Vdd. Each replica transistor (e.g. T2') possesses the same electrical characteristics as its related "original transistor" (e.g. T2). In the non-deflected state of the amplifier the reference current sources define the quiescent currents flowing through the output transistors.

In each of the circuit runs between the replica transistors T2', T4' and the respective current sources, a circuit node is provided, 36 and 38 respectively. The node 36 is connected via a resistance R5 with the first output node 16 and via a resistance R6 of equal size with the output node 18. The node 38 is connected via a resistance R7 with the output node 16 and via a resistance R8 of equal size with the output node 18. In the example of embodiment represented the resistances R5, R6 on the one hand, and the resistances R7, R8 on the other hand, are of equal size (and of the same size as the resistances R1 to R4).

When the amplifier circuit is in operation an additive superposition of two signal components takes place at each of the nodes 36, 38, of which a first signal component is a function of the current flowing through the output transistor T2 (for the node 36), and is a function of the current flowing through the output transistor T4 (for the node 38), and a second signal component is representative of the common mode potential. This second signal component is coupled to the circuit connections between the replica transistors and their reference current sources via the resistances R5, R6 (for the node 36) and via the resistances R7, R8 (for the node 38). The potentials prevailing at the nodes 36, 38 form a control input signal for a fourth transconductance stage 32 serving as a control amplifier, or for a minimum element 34 located in the circuit upstream of this stage.

The minimum element 34 has two inputs, each of which is connected to one of the circuit nodes 36, 38. The element 34 furthermore has an output connected with an inverting input of the transconductance stage 32, and has the task of forwarding the smaller of the two input potentials to this output. The implementation in circuitry of a minimum element of this kind is trivial for persons skilled in the art and therefore does not require any further elucidation.

The transconductance stage 32 furthermore possesses a non-inverting input at which the prescribable desired potential Vcm is applied. The two input potentials fed to the transconductance stage 32 thus form the differential input signal of this stage.

On the output side the transconductance stage 32 has an inverting output, which is connected with the supply potential Vss, and two non-inverting outputs, each of which is connected with one of the outputs of the transconductance stage 22. The transconductance stage 32 is therefore "embodied in duplicate", as has already been elucidated above for the transconductance stage 28.

With the previously described components a combined control of both the quiescent currents and also the common mode potential is once again realised, wherein the supplied desired potential Vcm (common to both control halves) defines the desired value for the common mode potential that is to be adjusted. The use of the minimum element 34 has the result that in this combination control the only signal that is taken into account of the signals provided at the superposition nodes 36, 38 is that which contains the signal component representative of the minimum current (of the currents flowing through the output transistors T2 and T4). In a deviation from this, however, another kind of weighting between the signals provided at the nodes 36, 38 could be undertaken. The reason why a minimum element is provided in this control half (and not a maximum element) is the p-type of the output transistors T2, T4 and the replica transistors T2', T4' provided in this half of the amplifier circuit, and the arrangement of the reference current sources between the replica transistors and the supply potential Vss (and not Vdd).

Deviating from the described example of embodiment the combination control could also be implemented with only one control amplifier of the kind described, which would then feed back in a suitable manner into the input stage or control stage.

With the amplifier circuit as described a qualitatively high grade, very universally applicable amplification can be provided, wherein the circuit is in particular suitable for comparatively small supply voltages (e.g. a difference between Vdd and Vss of less than 3V). By the provision of the control path with a large bandwidth the quality of the amplification and control can be maintained over a large range of frequencies for the amplifier input signal.

The invention claimed is:

1. An amplifier circuit, comprising:
a first supply terminal (12) and a second supply terminal (14) for supplying the circuit a first supply potential (Vss) and a second supply potential (Vdd),
an output stage with a first output node (16) and a second output node (18) for outputting a differential output signal (Voutn, Voutp), wherein
the first output node (16) is connected via a first output transistor (T1) with the first supply terminal (12), and via a second output transistor (T2) with the second supply terminal (14), and wherein
the second output node (18) is connected via a third output transistor (T3) with the first supply terminal (12), and via a fourth output transistor (T4) with the second supply terminal (14), and
a control stage, to which an input signal (Vinn, Vinp) can be applied to control the output transistors (T1-T4), for adjusting quiescent currents flowing through the output transistors (T1-T4), even in the absence of the input signal (Vinn, Vinp), and for adjusting the output signal (Voutn, Voutp) as a function of the input signal (Vinn, Vinp), and
a control path feeding back into the control stage for combining the quiescent currents of the output transistors (T1-T4) and a common mode potential of the differential output signal (Voutn, Voutp).

2. The amplifier circuit according to claim 1, wherein the control stage comprises replicas (T1'-T4')of the output transistors (T1-T4), each of which is arranged in series with a reference current source, and whose control terminals in each case are connected with one of the control terminals of the output transistors (T1-T4).

3. The amplifier circuit according to claim 1, wherein the control path comprises a control amplifier (28, 32,) to whose input is applied a control input signal, which contains two additive superimposed signal components, of which a first signal component is representative of at least one of the quiescent currents, and a second signal component is representative of the common mode potential.

4. The amplifier circuit according to claim 1, wherein the control stage comprises replicas (T1'-T4') of the output transistors (T1-T4), each of which is arranged in series with a reference current source, and whose control terminals in each case are connected with one of the control terminals of the output transistors (T1-T4),
the control path comprises a control amplifier (28, 32,) to whose input is applied a control input signal, which contains two additive superimposed signal components, of which a first signal component is representative of at least one of the quiescent currents, and a second signal component is representative of the common mode potential, and
the signal component representative of the quiescent current is provided at a circuit node (24, 26, 36, 38) between one of the replicas (T1'-T4') and the reference current source arranged with it in series.

5. The amplifier circuit according to claim 3, wherein the signal component representative of the common mode potential is provided at a circuit node (24, 26, 36, 38) that is connected with the two output nodes (16, 18) via two resistance elements (R1 -R8) of the same resistance value.

6. The amplifier circuit according to claim 4, wherein
the signal component representative of the common mode potential is provided at a circuit node (24, 26, 36, 38) that is connected with the two output nodes (16, 18) via two resistance elements (R1-R8) of the same resistance value.

7. The amplifier circuit according to claim 3, wherein
the first signal component representative of at least one of the quiescent currents is representative of one of the quiescent currents that has been selected as a minimum current.

8. The amplifier circuit according to claim 4, wherein
the first signal component representative of at least one of the quiescent currents is representative of one of the quiescent currents that has been selected as a minimum current.

9. The amplifier circuit according to claim 5, wherein
the first signal component representative of at least one of the quiescent currents is representative of one of the quiescent currents that has been selected as a minimum current.

\* \* \* \* \*